US008615382B2

(12) United States Patent
Dobyns et al.

(10) Patent No.: US 8,615,382 B2
(45) Date of Patent: Dec. 24, 2013

(54) TEST AND MEASUREMENT INSTRUMENT WITH COMMON PRESENTATION OF TIME DOMAIN DATA

(75) Inventors: Kenneth P. Dobyns, Beaverton, OR (US); Kathryn A. Engholm, Portland, OR (US); Amy M. Bergsieker, Tigard, OR (US); Steven C. Herring, Beaverton, OR (US); Gary J. Waldo, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 444 days.

(21) Appl. No.: 13/015,084

(22) Filed: Jan. 27, 2011

(65) Prior Publication Data
US 2012/0197598 A1  Aug. 2, 2012

(51) Int. Cl.
*H03F 1/26* (2006.01)

(52) U.S. Cl.
USPC ................ 702/189; 702/127; 702/190

(58) Field of Classification Search
USPC .......................... 702/127, 189–190
See application file for complete search history.

(56) References Cited

U.S. PATENT DOCUMENTS

| 5,524,281 A * | 6/1996 | Bradley et al. ............. 455/67.15 |
| 2002/0181404 A1* | 12/2002 | Insler et al. .................... 370/241 |
| 2004/0087279 A1* | 5/2004 | Muschallik et al. ............ 455/73 |

* cited by examiner

*Primary Examiner* — Mischita Henson
(74) *Attorney, Agent, or Firm* — Marger Johnson & McCollom PC; Thomas F. Lenihan

(57) ABSTRACT

A test and measurement instrument and method for generating IQ-based time domain waveform information and presenting the IQ-based time domain waveform information together with other time domain waveform on a common axis through a user interface. The test and measurement instrument can include, for example, one or more input terminals to receive an electrical signal under test, an analog-to-digital converter (ADC) to digitize the signal under test, a digital downconverter to produce I (in-phase) and Q (quadrature) baseband component information from the digitized signal, a memory configured to store the IQ baseband component information, a user interface, and a controller. The controller can be configured to generate an IQ-based time domain waveform using the IQ baseband component information, and present the IQ-based time domain waveform and a second time domain waveform on a common axis through the user interface.

23 Claims, 5 Drawing Sheets

TEST AND MEASUREMENT INSTRUMENT WITH COMMON PRESENTATION OF TIME DOMAIN DATA

BACKGROUND

This disclosure relates to test and measurement instruments, and more particularly, to test and measurement instruments where time domain data derived from downconverted IQ baseband component information can be presented with other time domain data on a common axis.

RF carrier signals can transmit information in a variety of ways based on variations in the amplitude, frequency, or phase of the carrier. For example, many modern transmission systems use frequency hopping or phase modulation to conform to communication standards and to provide improved functionality and interoperability among different devices.

Electronic devices can operate with signals in multiple frequency ranges. That is, an electronic device can have baseband signals, such as digital data, and optical, microwave, or radio frequency (RF) signals, such as modulated RF and/or optical carriers. For instance, baseband digital data can be used to modulate an RF carrier. Each of the baseband digital data and the modulated RF carrier can have associated time domain data.

As the baseband digital data and the modulated RF carrier can occupy different frequency ranges, analysis of the time domain signals representing the data encoded in the modulation can be difficult. In particular, frequency domain test and measurement instruments typically have a single channel and are otherwise deficient in the area of presenting and manipulating downconverted time domain data.

Therefore, it is difficult to present, manipulate and/or compare different types of time domain signals.

SUMMARY

Embodiments of the subject invention provide a test and measurement instrument and method for generating IQ-based time domain waveform information and presenting the IQ-based time domain waveform information together with one or more other time domain waveforms on a common axis through a user interface.

The test and measurement instrument can include, for example, one or more input terminals to receive an electrical signal under test, an analog-to-digital converter (ADC) to digitize the signal under test, a digital downconverter to produce I (in-phase) and Q (quadrature) baseband component information from the digitized signal, a memory configured to store the IQ baseband component information, a user interface, and a controller. The controller can be configured to generate an IQ-based time domain waveform using the IQ baseband component information, and present the IQ-based time domain waveform and a second time domain waveform on a common axis through the user interface.

The user interface can include horizontal controls such as horizontal position and/or scale controls. The controller can adjust the horizontal scale presentation of the IQ-based time domain waveform and adjust the horizontal scale presentation of additional time domain waveforms on the common axis responsive to a single adjustment of the horizontal scale control. Similarly, the controller can adjust the horizontal position presentation of the IQ-based time domain waveform and adjust the horizontal position presentation of the additional time domain waveforms on the common axis responsive to a single adjustment of the horizontal position control. Other controls such as horizontal zoom or pan can also be used to adjust the waveforms.

The user interface can also include multi-channel vertical controls such as vertical position and/or scale controls for each channel. The vertical controls can control, for example, the vertical position and/or vertical scale of any individual one of the IQ-based time domain waveform or the other time domain waveforms, substantially independent of any other time domain waveform. Such adjustments can be made for an individual waveform associated with a corresponding channel.

The IQ-based time domain waveform can be adjusted to at least partially overlap the other time domain waveforms, or visa-versa, for visual comparison. Alternatively, the IQ-based time domain waveform can be adjusted to be spaced apart from the other time domain waveforms for visual comparison.

DETAILED DESCRIPTION

Figure 1:
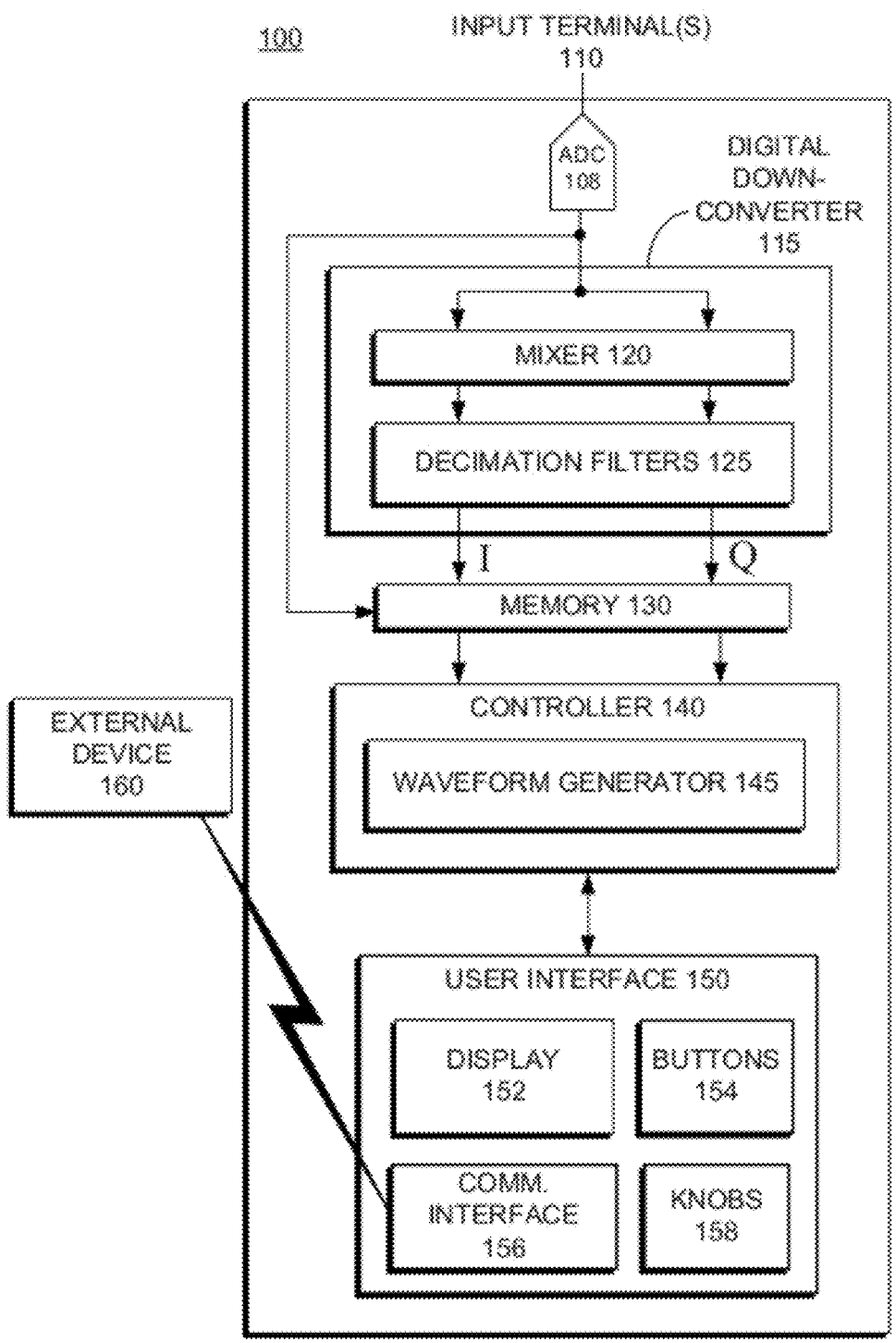
FIG. 1 illustrates a block diagram of a test and measurement instrument according to an example embodiment of the invention.

FIG. 1 illustrates a block diagram of a test and measurement instrument 100 according to an example embodiment of the invention. The test and measurement instrument 100 can be a digital oscilloscope, Real Time Signal/Spectrum Analyzer (RTSA), or other suitable measurement device. For the sake of brevity and consistency, but not limitation, the test and measurement instrument will generally be referred to herein as an oscilloscope. The oscilloscope 100 can include an analog-to-digital converter (ADC) 108, a digital downconverter 115, a controller 140 including a waveform generator 145, and a user interface 150, according to an example embodiment of the invention The oscilloscope 100 may have multiple channels or inputs, such as input terminal 110, suitable for use with various embodiments as described herein. Although the oscilloscope may have a single input terminal 110, inventive aspects described are equally applicable to an oscilloscope having two inputs, four inputs, or any number of inputs. While components of the oscilloscope 100 are shown to be directly coupled to each other, it should be understood that the oscilloscope 100 can include a variety of other circuit or software components, inputs, outputs, and/or interfaces, which are not necessarily shown, but that are disposed between or otherwise associated with the illustrated components of oscilloscope 100.

An electrical signal under test, such as an RF signal, is received at the input terminal 110. The RF signal can be converted to an analog intermediate frequency (IF) signal that is filtered prior to being digitized by an ADC 108. However, reference herein will generally be made to an "RF signal" or "RF signals" and it should be understood that such reference can include one or more RF signal, or, one or more IF signal derived from the RF signal.

The ADC 108 is structured to digitize the RF signal under test. The digital downcoverter 115 is operatively coupled to the ADC 108, receives the digitized RF signal, and produces I (in-phase) and Q (quadrature) baseband component data or signals from the digitized RF signal. More specifically, mixer 120 can numerically multiply a sine and cosine with the digitized RF signal, thereby generating the I and Q component information, which contains all of the information present in the original RF signal. The signal component data can thereafter be decimated using the decimation filters 125, which digitally filters and reduces the number of samples and noise associated with the signals.

An acquisition memory 130 is operatively coupled to the digital downconverter 115 and is configured to acquire and store the digitized I and Q baseband component information associated with the RF signal. In other words, the acquisition memory 130 can receive the I and Q baseband component information from the digital downconverter 115 and store it. In some embodiments, the digitized data output by the ADC 108 may be stored directly to a memory first, such as memory 130, and then accessed by the downconverter 115 to produce the I and Q baseband component information. A channel can be associated with an input terminal 110, which acquires data that has information encoded in the frequency domain. Such a channel can include different style attenuators and amplifiers (not shown), as well as a downconverter such as the downconverter 115 to select a portion of the signals' frequency content for acquisition.

In some embodiments, the digitized data may correspond to raw data that is directly received and sampled in the time domain, and stored directly to the memory 130, which may then be accessed, for example, by the controller 140. Raw data that is sampled in the time domain can be associated with a channel generally used to directly acquire information in the time domain. Such a channel can include digitizers such as multi-bit analog to digital converters, decimators, comparators for sensing discrete levels, and so forth. Such a channel can include other circuitry, such as amplifiers, input protection, or other conditioning circuitry (not shown). Accordingly, information stored in memory 130 can include the digitized version of the input signal sampled in the time domain.

Each input terminal 110 of the oscilloscope can have associated therewith a different portion of the acquisition memory 130 or a different record in which the component information is stored. The acquisition memory 130 can be any variety of memory. For example, the acquisition memory 130 can be volatile memory, non-volatile memory, dynamic random-access memory, static memory, among other suitable memory types.

A controller 140 is operatively coupled to the acquisition memory 130 and receives the I and Q component information. The controller 140 is also coupled to the user interface 150, processes the signals under test, and produces corresponding waveforms, traces, and/or markers using the waveform generator 145 for display through the user interface 150. Alternatively, or in addition to presenting the waveforms, the controller 140 can cause a transmission of such information to an external device 160 either wirelessly or via a conductor such as a bus or a wire attached to the communication interface module 156 of the user interface 150. Conversely, the controller can receive commands or other information from the external device 160 through the communication interface module 156. The external device 160 can include, for example, a computer separate from the test and measurement instrument, or an external memory device, among other possibilities.

The controller 140 can include a waveform generator 145. The waveform generator 145 can generate one or more IQ-based time domain traces using the I and Q baseband component information. Reference is made herein to IQ-based time domain waveforms or traces, which refer to signals and/or traces derived from I and Q component information or data, but within the time domain, as contrasted with the frequency-domain.

For example, after downconversion, the waveform generator 145 can generate a phase value by calculating an arctangent of (Q divided by I), i.e., ARCTAN(Q/I). The waveform generator 145 can also generate a frequency value by calculating a derivative with respect to time of the phase, i.e., d/dt (phase). The phase values and the frequency values are used to plot phase-versus-time and frequency-versus-time traces, respectively. In addition, the waveform generator 145 can generate an amplitude (i.e., power-versus-time) trace, which can be generated, for example, by taking a square-root of the square of I added to the square of Q for each IQ pair (e.g., SQRT(I^2+Q^2)).

The controller 140 can present the IQ-based time domain waveform or waveforms together with one or more additional time domain waveforms on a common axis, as further described below. In some embodiments, the additional waveform can be a second IQ-based time domain waveform having a different format than the first IQ-based time domain waveform, although generated using the same IQ baseband component information associated with the signal under test.

For instance, a frequency-versus-time waveform can be presented together with a phase-versus-time waveform, each generated using the I and Q baseband component information stored in memory 130 and associated with a particular input terminal 110. In some embodiments, the additional waveform can be produced from raw data that is directly received and sampled in the time domain, and presented on the common axis with the IQ-based time domain waveform or waveforms. Other types of IQ-based time domain can be presented on the common axis including, for example, an individual trace of the I baseband component information or an individual trace of the Q baseband component information. In addition, amplitude or power-versus-time, symbol-versus-time, or any other suitable IQ-based time domain waveform can be simultaneously displayed through the user interface 150 on the common axis together with other time domain information.

Moreover, the controller 140 can be configured to adjust the acquisition parameters of one or more channels responsive to input received through the user interface 150. The controller 140 can be any variety of circuitry. For example, the controller 140 can include analog and/or digital circuitry. The controller 140 can include general purpose processors, digital signal processors, application specific integrated circuits, programmable gate arrays, or the like. The controller 140 can also include appropriate circuitry to interface with the user interface 150, the memory 130, and the like. In an embodiment, a personal computer (PC) can include the controller 140, memory 130, user interface 150, or any combination of these components, or the like.

The user interface 150 can include a variety of different interfaces. Illustrated examples include a display 152, buttons 154, knobs 158, and a communication interface 156. Any variety of user interfaces can be used. For example, the communication interface 156 can be a wired or wireless interface, a network interface such as an Ethernet port, an infrared interface, an RF interface, or the like. The display 152 can be a CRT, an LCD, a projection, or the like. Such interfaces can be combined together. For example, a display 152 can be a touch screen allowing buttons 154 to be presented on the display 152. The user interface 150 can be driven using a touch screen, mouse, remote interface, or other suitable programmatic means.

As described above, the oscilloscope 100 can acquire IQ-based time domain information or other data directly sampled in the time domain and store such information in memory 130. In some embodiments, the user interface 150 can be configured to present such time domain data in association with a common axis. In particular, IQ-based time domain data can be presented through the user interface on a common axis with other time domain data. As will be described in further detail below, time-related controls, such as time per division, position controls, zoom controls, or the like can be used in analyzing such IQ-based time domain data and other time domain data.

The display 152 is adapted to display the one or more IQ-based time domain waveforms together (i.e., spaced apart from, near to, or overlapping with one another) with the additional time domain waveforms, within a same window or graticule of the display unit. It should be understood that the display 152 can include multiple time domain graticules, and in some embodiments of the invention, the user can move any time domain waveform to any time domain graticule. The buttons 154 and/or knobs 158 can be used to adjust or manipulate the acquisition, presentation, and/or relationship between the different waveforms. The user can also adjust or manipulate the acquisition, presentation, and/or relationship between the different waveforms using a touch screen, mouse, remote interface, or other suitable programmatic means.

Any of the components of the oscilloscope 100, including the ADC 108, the digital downconverter 115, the controller 140 including the waveform generator, and the user interface 150 may exist in or be implemented using hardware, software, firmware, or by any combination thereof.

Figure 2:
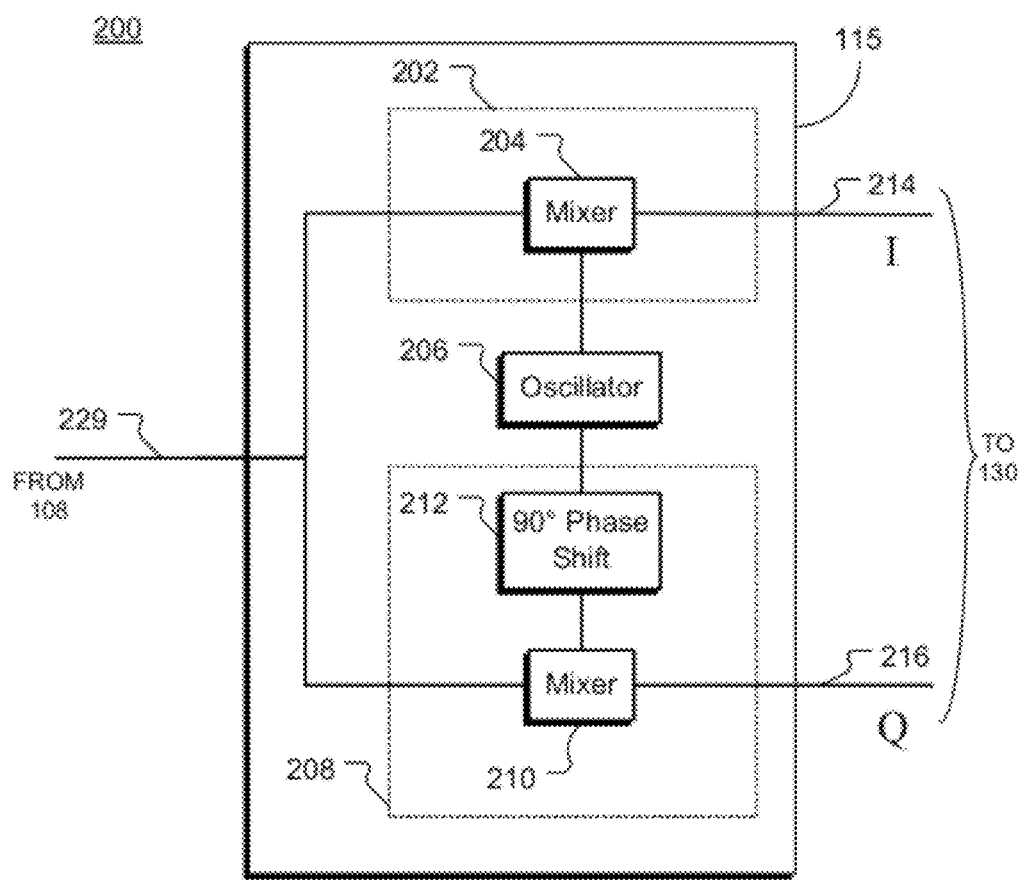
FIG. 2 illustrates a block diagram of an example of the digital downconverter in the test and measurement instrument of FIG. 1.

FIG. 2 illustrates a block diagram 200 of an example of the digital downconverter 115 in the oscilloscope 100 of FIG. 1. In this embodiment, the digitized signal 229 is input to both an in-phase path 202 and a quadrature phase path 208. Each path is configured to receive a signal from a local oscillator 206; however, the quadrature phase path 208 is configured to receive a signal that is 90 degrees out of phase with the signal received by the in-phase path 202.

Each path 202 and 208 is configured to mix the input signal 229 with the corresponding signal from the local oscillator 206. Thus, the in-phase (I) signal 214 and the quadrature phase (Q) signal 216 are created. Additional filtering and/or decimation can be applied to the signals 214 and 216 as desired. In an embodiment, the oscillator 206 can be a digital oscillator. The mixing performed in the respective paths 202 and 208 can be digital mixing, multiplication, or the like. Although only mixers 204 and 210 of paths 202 and 208, respectively, have been illustrated, the paths 202 and 208 can include digital filters, scalers, decimators, or the like as desired. As described with respect to FIG. 1, these signals can be stored in the memory 130, further processed to generate other time domain signals, or the like. It should be understood that the embodiment shown in FIG. 2 is an example of techniques and circuitry to extract such IQ baseband component time domain information from a digitized RF signal.

Figure 3:
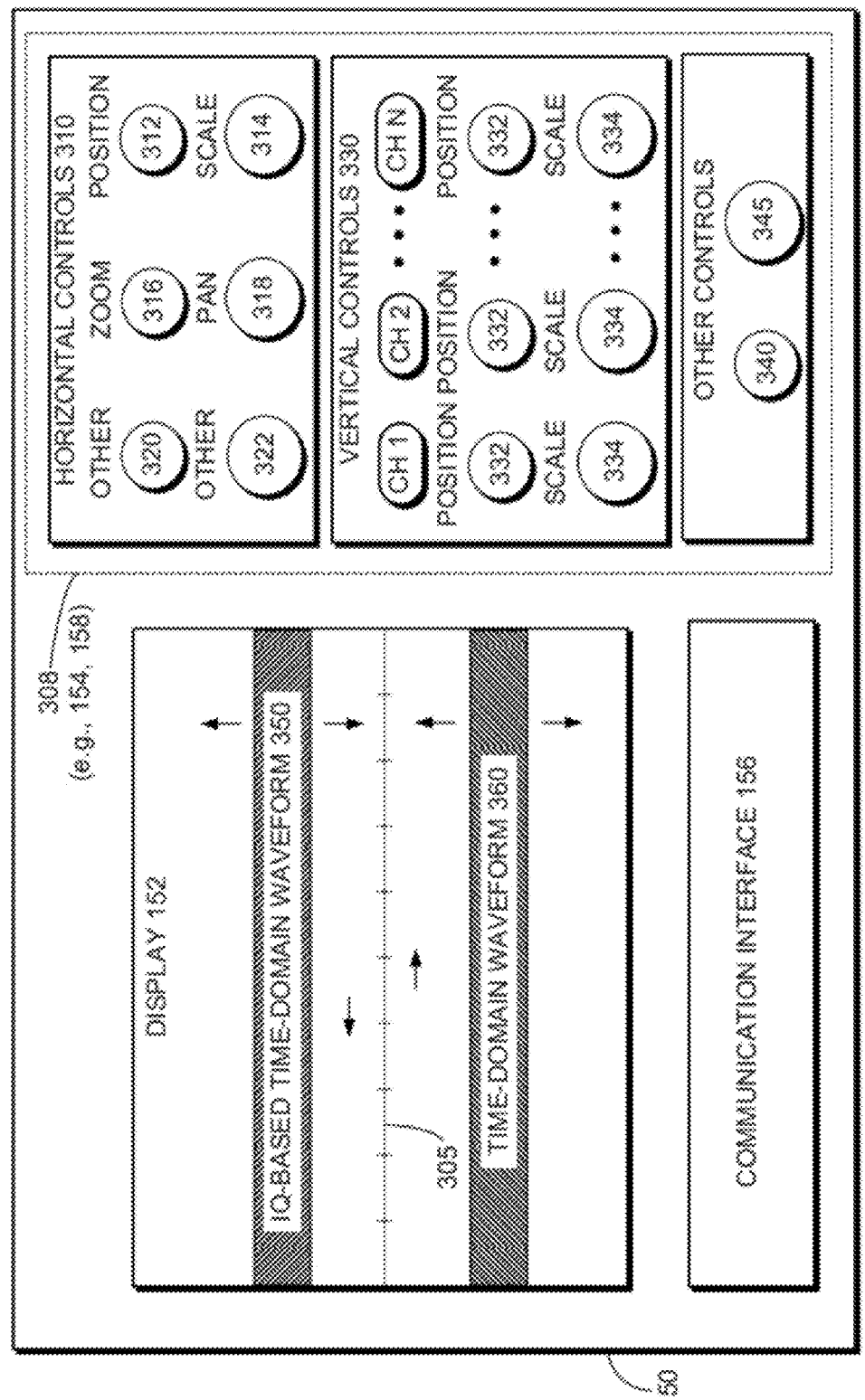
FIG. 3 illustrates an example of a user interface of a test and measurement instrument presenting IQ-based time domain waveform information on a common axis with other time domain data.

FIG. 3 illustrates an example of a user interface 150 of a test and measurement instrument 100 presenting IQ-based time domain waveform information 350 on a common axis 305 with other time domain data 360. In this embodiment, the user interface 150 includes a display 152, communication interface 156, and interface controls 308 including horizontal controls 310, multi-channel vertical controls 330, and/or other controls 340 and 345. Such controls are examples of possible controls of the user interface 150.

As described above, IQ-based time domain signals can be presented on or associated with a common axis 305 with other time domain signals. For example, the IQ-based time domain waveform 350 can be simultaneously displayed with time domain waveform 360. The time domain waveform 360 can be an IQ-based time domain waveform having a format different from or the same as the IQ-based time domain waveform 350. Alternatively, or in addition to, the time domain waveform 360 can be a time domain waveform produced from a signal that is directly received and sampled in the time domain. The IQ-based time domain waveform or waveforms can include, for example, a frequency-versus-time waveform, a phase-versus-time waveform, a power-versus-time waveform, and a symbol-versus-time waveform, among other suitable IQ-based time domain waveforms. In addition, the controller can be configured to directly display the individual I and Q baseband component information on or in association with the common axis 305.

The interface controls 308 includes horizontal scale controls 310. The horizontal controls can include, for example, a horizontal scale control 314, a horizontal position control 312, a zoom control 316, a pan control 318, and/or other suitable horizontal controls such as 320 or 322. The controller 140 (of FIG. 1) can adjust the horizontal scale presentation of the IQ-based time domain waveform 350 and adjust the horizontal scale presentation of the time domain waveform 360 on the common axis 305 responsive to a single adjustment of the horizontal scale control 314. Similarly, the controller can adjust the horizontal position presentation of the IQ-based time domain waveform 350 and adjust the horizontal position presentation of the time domain waveform 360 on the common axis responsive to a single adjustment of the horizontal position control 312.

Furthermore, the controller can adjust the zoom presentation of the IQ-based time domain waveform 350 and adjust the zoom presentation of the time domain waveform 360 on the common axis 305 responsive to a single adjustment of the zoom control 316. In addition, the controller can adjust the pan presentation of the IQ-based time domain waveform 350 and adjust the pan presentation of the time domain waveform 360 on the common axis 305 responsive to a single adjustment of the pan control 318. Other controls, such as 320 and 322, can be used to simultaneously manipulate or adjust horizontal presentation aspects of waveforms 350 and 360.

The interface controls 308 also include multi-channel vertical controls 330. The vertical controls 330 can include, for example, vertical position controls 332 and/or vertical scale controls 334 for each of channels CH1, CH2, through CHN. The vertical controls 330 can control, for example, the vertical position and/or vertical scale of any individual one of the IQ-based time domain waveform 350 or the time domain waveform 360, substantially independent of any other time domain waveform. Such adjustments can be made for an individual waveform associated with a corresponding channel such as CH1, CH2, through CHN, as shown in FIG. 3.

For example, if the IQ-based time domain waveform 350 is associated with CH2, then CH2 can be selected by a user of the oscilloscope, and the vertical position of the IQ-based time domain waveform 350 can be adjusted using the vertical position control 332 associated with CH2. Similarly, if the time domain waveform 360 is associated with CH1, then the vertical position of waveform 360 can be adjusted using the vertical position control 332 associated with CH1.

More specifically, the controller 140 (of FIG. 1) can adjust the vertical scale presentation of any individual one of the IQ-based time domain waveform 350 and the time domain waveform 360 on the common axis 305 responsive to the vertical scale control 334 substantially independent of the vertical scale presentation of any other time domain waveform. In addition, the control can adjust the vertical position presentation of any individual one of the IQ-based time domain waveform 350 and the time domain waveform 360 on the common axis 305 responsive to the vertical position control 332 substantially independent of the vertical position presentation of any other time domain waveform. The IQ-based time domain waveform 350 can be adjusted to at least partially overlap the time domain waveform 360, or visa-versa, for visual comparison. Alternatively, the IQ-based time domain waveform 350 can be adjusted to be spaced apart from the time domain waveform 360 for visual comparison.

In some embodiments, the controller 140 can adjust the vertical scale presentation of one or more of the IQ-based time domain waveform 350 and the time domain waveform 360 simultaneously and responsive to a single adjustment of the vertical scale control 334. Similarly, the controller 140 can adjust the vertical position presentation of one or more of the IQ-based time domain waveform 350 and the time domain waveform 360 simultaneously and responsive to a single adjustment of the vertical position control 332. In other words, different traces can be controlled or otherwise linked and adjusted together by a single action.

The IQ-based time domain waveform 350 can include different types or formats of waveforms and/or traces as mentioned above. For instance, a frequency-versus-time waveform having a horizontal axis representative of time, and a vertical axis representative of frequency, can be simultaneously displayed with another time domain waveform. Similar to frequency-versus-time, a power-versus-time trace, in which the horizontal axis is representative of time, and the vertical axis is representative of amplitude or power—typically on a log scale instead of voltage on a linear scale—can be compared or adjusted relative to another time domain waveform. In addition, a phase-versus-time waveform in which the horizontal axis is representative of time, and the vertical axis is representative of the range of phase values, can be presented with and visually compared to another time domain waveform. Any number of different IQ-based time domain waveforms and/or other time domain waveforms can be simultaneously presented on display 152, and either simultaneously or individually adjusted using interface controls 308. It should be understood that interface controls 308 can include the buttons 154 and/or knobs 158 of FIG. 1, and/or other suitable input means such as touch screens, actuators, mice or sensors.

Figure 4:
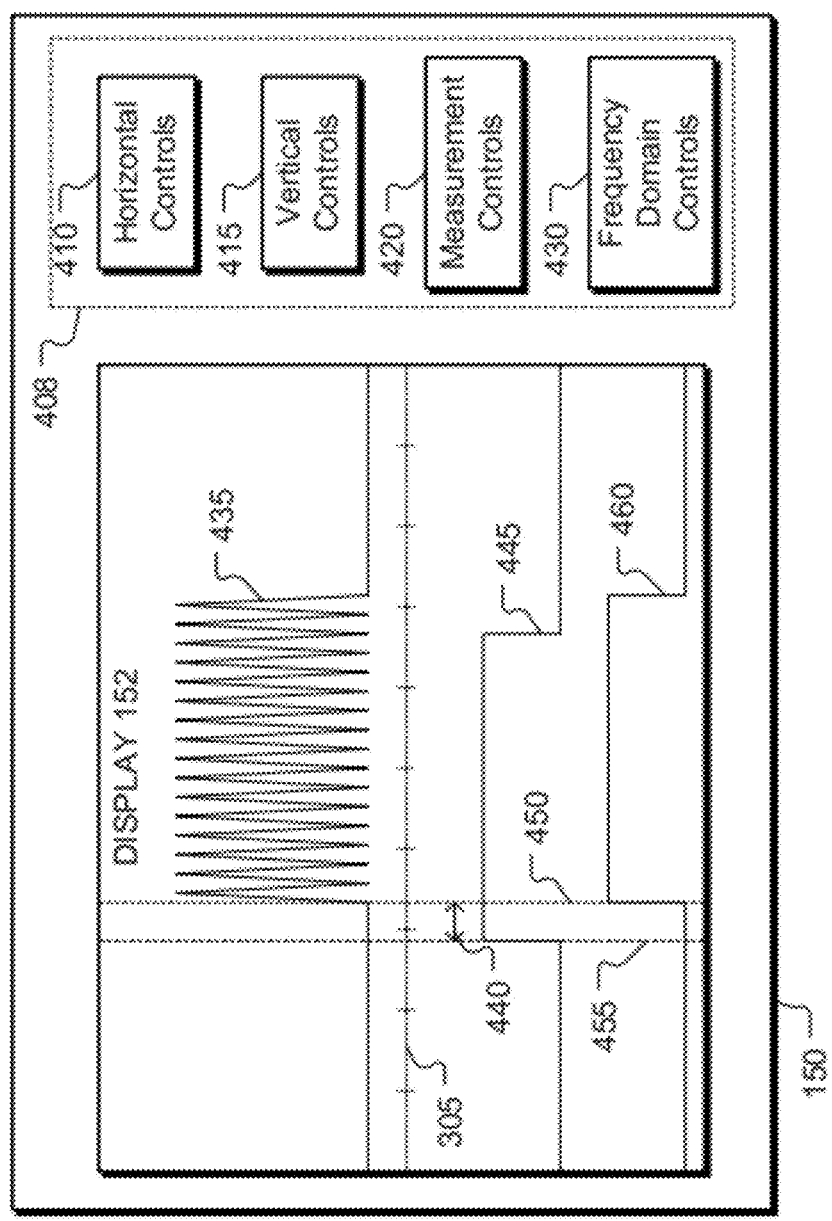
FIG. 4 illustrates another example of a user interface of a test and measurement instrument presenting downconverted time domain waveform information on a common axis with other time domain data.

FIG. 4 illustrates another example of a user interface 150 of a test and measurement instrument 100 presenting downconverted time domain waveform information on a common axis 305 with other time domain data. In this embodiment, a user interface 150 includes a display 152 and multi-channel horizontal and vertical controls 410 and 415, measurement controls 420, and frequency domain controls 430. Such controls are examples of possible controls of the user interface 150. However, such controls of the time domain interface 408 can include other controls, can be combined together, or the like as desired.

As described above, IQ-based time domain signals can be presented on a common axis 305 with other time domain signals. For example, an RF signal is displayed as trace 435. Trace 445 is a signal associated with the RF signal 435, such as a portion of a data stream used to modulate the RF signal with on-off modulation. Trace 460 can represent a time domain signal from the RF signal, such as an amplitude of the RF signal 435. Although the RF signal 435 and the time domain trace 460 have been illustrated on the same display 152, the RF signal 435 need not be presented to a user. However, the encoded time domain waveform can still be displayed. Furthermore, such an RF signal 435 need not be acquired at all; rather, the encoded time domain signals can be acquired.

Since IQ-based time domain data has been presented on a common axis 305 as other time domain signals, the IQ-based time domain data can be analyzed as other time domain signals in a similar context. For example, markers 455 and 450 have been positioned at the leading edge of the data 445 and the leading edge of the amplitude 460. A user can manipulate the markers 455 and 450 through the measurement controls 420 or other similar interface of the user interface 150. Accordingly, a time 440 can be measured. In this example, the time 440 can represent a delay between a change in the data 445 and the corresponding change in amplitude of the RF signal 435. Furthermore, a user can manipulate the vertical and horizontal scale, position, or the like through the corresponding horizontal and vertical controls 410 and 415. Thus in this example, the decoded attribute of the RF signal 435 can be used as any other time domain signal.

In another example, the vertical controls 415 can be used to offset, scale, or otherwise manipulate the traces on the display 152. For instance, the vertical controls 415 can include an input to control on offset and a scale of each trace 435, 445, and 460. Thus, a user can manipulate the traces such that the traces are separated as illustrated, overlapping for visual comparison, or the like.

In another example, the horizontal controls 410 can be used to analyze the time domain signals. A time per division, position, or other horizontal control 410 can be changed. The presentation of the time domain signals including the IQ-based time domain signals can be changed accordingly. For example, a signal of interest could be identified on a trace. However, the time span is too large for adequate resolution. The time per division control and position control can be changed to center on the signal and decrease the time per division to obtain a finer resolution. In particular, when adjusting these controls the presentation of the time domain signals on the common axis 305 can each be changed. Thus, a user can investigate the signal with other time domain signals on the common axis 305. Although the various time domain signals are presented on a common axis 305, the acquisition parameters need not be the same for the various waveforms.

Moreover, although a particular example of horizontal controls 410 or time-based controls have been given with reference to FIG. 4, other similar controls can be part of the horizontal controls 410. For example, a zoom control can be used to provide a zoomed in presentation of the time domain data. Since the IQ-based time domain data can be presented with other time domain data on the common axis 305, each of such signals can be analyzed in further detail through a zoom control.

Although a display 152 is given as an example, the presentation of the time domain signals can be presented as desired through other interfaces of the user interface 150. For example, the data can be streamed through a communication interface 156 described above. In another example, the data can be stored for later analysis. Regardless, analysis of the time domain signals can be performed in a similar context.

Figure 5:
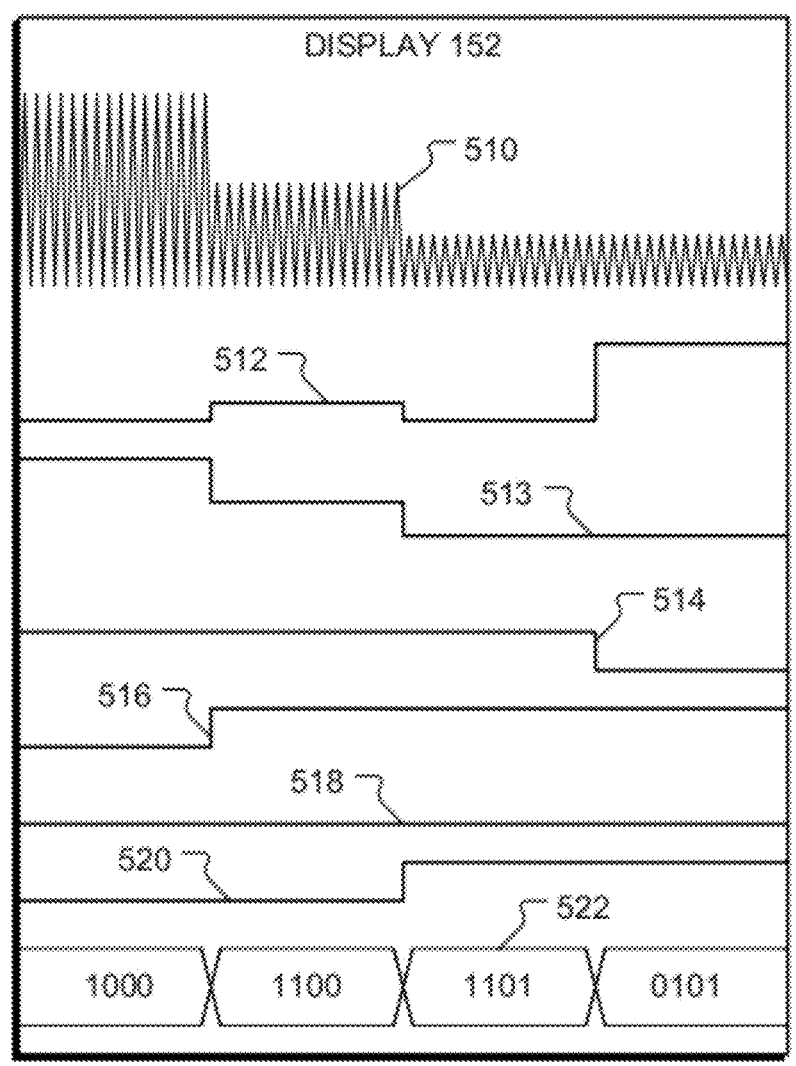
FIG. 5 is an example of a display of a user interface of a test and measurement instrument presenting IQ-based time domain data together with other time domain data in accordance with embodiments of the present invention.

FIG. 5 is an example of a display 152 of a user interface 150 of a test and measurement instrument 100 presenting IQ-based time domain data together with other time domain data in accordance with embodiments of the present invention. In some embodiments, the controller 140 (of FIG. 1) can be configured to cause the user interface 150 (e.g., of FIG. 3) to present IQ-based time domain data together with other time domain data. For example, modulated RF signal 510 can be a 16 quadrature amplitude modulated (16-QAM) signal. Signal 512 can represent the phase of the modulated signal relative to the carrier. Signal 513 can represent the amplitude envelope of the modulated signal. The signals illustrated in FIG. 5 are representative of the waveforms discussed herein. It should be understood that other waveforms corresponding to phase, amplitude, and so forth, can be implemented in accordance with any of the embodiments of the invention disclosed herein.

From the phase 512 and amplitude 513, various forms of demodulated data can be presented. Signals 514, 516, 518, and 520 can represent the four bits represented by the various states of the 16-QAM signal. Signal 522 can represent the encoded four bit nibble. That is, the demodulated data can be presented as desired, whether by the encoded bits, the encoded symbols, or the like.

Although particular embodiments have been described, it will be appreciated that the principles of the invention are not limited to those embodiments. In some embodiments, an article comprising a machine-accessible non-transitory medium having associated instructions that, when executed in a test and measurement instrument, results in a machine performing the steps of the various embodiments of the invention as disclosed herein. Other variations and modifications may be made without departing from the principles of the invention as set forth in the following claims.

The invention claimed is:

1. A test and measurement instrument, comprising:
one or more input terminals to receive an electrical signal under test;
one or more analog-to-digital converter (ADC) to digitize the signal under test;
a digital downconverter to produce I (in-phase) and Q (quadrature) baseband component information from the digitized signal;
a memory configured to store the IQ baseband component information;
a user interface; and
a controller configured to:
generate an IQ-based time domain waveform using the IQ baseband component information; and
present the IQ-based time domain waveform and a second time domain waveform on a common axis through the user interface.

2. The test and measurement instrument of claim 1, wherein:
the IQ-based time domain waveform comprises a first IQ-based time domain waveform; and
the second time domain waveform comprises a second IQ-based time domain waveform having a different format than the first IQ-based time domain waveform, and is generated using the IQ baseband component information associated with the signal under test.

3. The test and measurement instrument of claim 1, further comprising one or more input terminals to directly receive and sample an electrical signal in the time domain, wherein:
the second time domain waveform is based on the signal that is directly received and sampled in the time domain; and
the controller is configured to present the second time domain waveform on the common axis with the IQ-based time domain waveform.

4. The test and measurement instrument of claim 1, wherein the controller is configured to generate the IQ-based time domain waveform as at least one of a frequency-versus-time waveform, a phase-versus-time waveform, a power-versus-time waveform, and a symbol-versus-time waveform.

5. The test and measurement instrument of claim 1, wherein:
the user interface includes a horizontal scale control; and
the controller is further configured to adjust the horizontal scale presentation of the IQ-based time domain waveform and adjust the horizontal scale presentation of the second time domain waveform on the common axis responsive to a single adjustment of the horizontal scale control.

6. The test and measurement instrument of claim 1, wherein:
the user interface includes a horizontal position control; and
the controller is further configured to adjust the horizontal position presentation of the IQ-based time domain waveform and adjust the horizontal position presentation of the second time domain waveform on the common axis responsive to a single adjustment of the horizontal position control.

7. The test and measurement instrument of claim 1, wherein:
the user interface includes a zoom control; and
the controller is further configured to adjust the zoom presentation of the IQ-based time domain waveform and adjust the zoom presentation of the second time domain waveform on the common axis responsive to a single adjustment of the zoom control.

8. The test and measurement instrument of claim 1, wherein:
the user interface includes a pan control; and
the controller is further configured to adjust the pan presentation of the IQ-based time domain waveform and adjust the pan presentation of the second time domain waveform on the common axis responsive to a single adjustment of the pan control.

9. The test and measurement instrument of claim 1, wherein:
the user interface comprises a vertical scale control; and
the controller is further configured to adjust the vertical scale presentation of the IQ based time domain waveform and adjust the vertical scale presentation of the second time domain waveform on the common axis responsive to a single adjustment of the vertical scale control.

10. The test and measurement instrument of claim 1, wherein:
the user interface comprises a vertical position control; and
the controller is further configured to adjust the vertical position presentation of the IQ-based time domain waveform and adjust the vertical position presentation of the second time domain waveform on the common axis responsive to a single adjustment of the vertical position control.

11. The test and measurement instrument of claim 1, wherein:
the user interface comprises a vertical scale control; and
the controller is further configured to adjust the vertical scale presentation of any individual one of the IQ-based time domain waveform and the second time domain waveform on the common axis responsive to the vertical scale control substantially independent of the vertical scale presentation of any other time domain waveform.

12. The test and measurement instrument of claim 1, wherein:
the user interface comprises a vertical position control; and
the controller is further configured to adjust the vertical position presentation of any individual one of the IQ-based time domain waveform and the second time domain waveform on the common axis responsive to the vertical position control substantially independent of the vertical position presentation of any other time domain waveform.

13. The test and measurement instrument of claim 12, wherein the IQ-based time domain waveform at least partially overlaps the second time domain waveform for visual comparison.

14. The test and measurement instrument of claim 12, wherein the IQ-based time domain waveform is spaced apart from the second time domain waveform for visual comparison.

15. A method for presenting time domain information on a test and measurement instrument, the method comprising:
receiving an electrical signal under test;
digitizing the signal under test;
downconverting the digitized signal, wherein downconverting includes producing I (in-phase) and Q (quadrature) baseband component information;
storing the IQ baseband component information;
generating an IQ-based time domain waveform using the IQ baseband component information; and
presenting the IQ-based time domain waveform and a second time domain waveform on a common axis through a user interface.

16. The method of claim 15, wherein generating includes producing the IQ-based time domain waveform as at least one of a frequency-versus-time waveform, a phase-versus-time waveform, a power-versus-time waveform, and a symbol-versus-time waveform.

17. The method of claim 15, further comprising:
adjusting a horizontal presentation of the IQ-based time domain waveform and adjusting a horizontal presentation of the second time domain waveform on the common axis responsive to a single adjustment of a horizontal control.

18. The method of claim 15, further comprising:
adjusting a vertical scale presentation of any individual one of the IQ-based time domain waveform and the second time domain waveform on the common axis responsive to a vertical scale control substantially independent of the vertical scale presentation of any other time domain waveform.

19. The method of claim 15, further comprising:
adjusting a vertical position presentation of any individual one of the IQ-based time domain waveform and the second time domain waveform on the common axis responsive to a vertical position control substantially independent of the vertical position presentation of any other time domain waveform.

20. The method of claim 15, further comprising:
adjusting a vertical position presentation of the IQ-based time domain waveform and adjusting a vertical position presentation of the second time domain waveform on the common axis responsive to a single adjustment of a vertical position control.

21. The method of claim 15, further comprising:
adjusting a vertical scale presentation of the IQ-based time domain waveform and adjusting a vertical scale presentation of the second time domain waveform on the common axis responsive to a single adjustment of a vertical scale control.

22. The method of claim 15, further comprising:
adjusting the position of the IQ-based time domain waveform or the second time domain waveform so that the waveforms are spaced apart from one another as presented through the user interface; and
adjusting the position of the IQ-based time domain waveform or the second time domain waveform so that the waveforms are at least partially overlapping with one another as presented through the user interface.

23. An article comprising a machine-accessible non-transitory medium having associated instructions that, when executed, results in a machine performing the steps of claim 15.

* * * * *